United States Patent
Wang et al.

[19]

[11] Patent Number: 5,963,830
[45] Date of Patent: Oct. 5, 1999

[54] METHOD OF FORMING A TIN/W BARRIER LAYER FOR A HOT AL PLUG

[75] Inventors: Pei-Jan Wang; Yeong-Ruey Shiue; Yung-Tsun Lo; Hsien-Liang Meng, all of Hsin-Chu, Taiwan

[73] Assignee: Mosel Vitelic Incorporated, Hsin Chu, Taiwan

[21] Appl. No.: 08/960,108

[22] Filed: Oct. 27, 1997

Related U.S. Application Data

[63] Continuation of application No. 08/691,677, Aug. 2, 1996, abandoned.

[51] Int. Cl.⁶ .................................................. H01L 21/44
[52] U.S. Cl. ........................ 438/653; 438/654; 438/656; 438/688
[58] Field of Search ..................... 438/628, 629, 438/672, 627, 644, 643, 648, 653, 654, 656, 685, 688, 763; 257/750, 773

[56] References Cited

U.S. PATENT DOCUMENTS

| | | | |
|---|---|---|---|
| 4,884,123 | 11/1989 | Dixit et al. | 437/190 |
| 5,070,391 | 12/1991 | Liou | 357/71 |
| 5,358,901 | 10/1994 | Fiordalice et al. | 437/192 |
| 5,389,194 | 2/1995 | Rostoker | 156/636 |
| 5,514,622 | 5/1996 | Bornstein | 438/189 |
| 5,521,121 | 5/1996 | Tsai et al. | 437/190 |
| 5,527,736 | 6/1996 | Huang et al. | 437/190 |

OTHER PUBLICATIONS

Silicon Processing for the VLSI Era, Volume 1—Process Technology, Wolf, S. and R.N. Tauber, Lattice Press, pp. 332 & 369, 1986.

*Primary Examiner*—Olik Chaudhuri
*Assistant Examiner*—Kurt Eaton
*Attorney, Agent, or Firm*—Bacon & Thomas

[57] ABSTRACT

The present invention relates to a method of forming a barrier metal layer for a hot Al plug and its structure and more particularly to remarkably ameliorate the performance of a barrier metal layer preventing Al metal used as an interconnection layer from diffusing into a silicon substrate. A barrier metal layer according to the present invention is a stacked structure comprising a top layer of Tungsten (W) formed by a Chemical Vapor Deposition (CVD) method and a bottom layer of TiN. Then, a Al interconnection layer deposited at high temperature fills a plug and finishes a plug structure having advantages of low manufacturing cost and full prevention of Al diffusion.

5 Claims, 1 Drawing Sheet

METHOD OF FORMING A TIN/W BARRIER LAYER FOR A HOT AL PLUG

This application is a Continuation of application Ser. No. 08/691,677, filed on Aug. 2, 1996, now abandoned.

DESCRIPTION OF THE PRIOR ART

The dimension of IC chips becomes more miniature to meet the demand for higher integration density and thus results in more narrow line width from micrometer to submicrometer. A multilevel metalization structure is needed to fulfill the requirement of complicated metal interconnections to save interconnecting occupation area.

An Inter Metal Dielectric (IMD) layer is sandwiched between metal layers for a purpose of their isolation and a plurality of of vias formed on an IMD layer is used as their interconnections. The first metal layer of a multilevel metalization structure is formed over source/drain regions of field effect transistors and opening of first metal layer is not called vias but contact holes. The outlooking shape of both contact holes and vias resembles mouths of bottles so something like plugs is needed for interconnections. Plugs used in contact holes are called contact plugs, while via plugs are used in vias. Recently, a variety of material systems and structures of plugs are developed but accompanying their disadvantages. Tungsten (W) formed by a CVD method having advantages of a type of conformal step coverage and a refractory nature is used as material of plugs. If the whole plugs are made by W, the large amount of expensive $WF_s$ gas would be exhausted and inevitablyincrease manufacturing cost which loses competitiveness of the product. While Al material is widely used as interconnection material since it has not only low price but easily accessible. However, the key factor that limits Al in plug application is that Al atoms may diffuse into underlying silicon substrate (i.e. source/drain regions of field effect transistors) in following high temperature processes such as metal sputtering and thus form Al pits with a shape of spike which causes a leakage current of source/drain regions and a reliability problem.

In order to solve Al pits, a barrier metal layer such as TiN is conventionally formed beneath Al layer to prevent Al atoms from diffusion into silicon substrate. A TiN layer may be formed by a variety of methods. For example, it is formed by reactive sputtering Ti target in $N_2$ ambient. Or, it is formed by first depositing Ti layer by a sputtering method and then annealed by a rapid thermal nitridation in a $N_2$ or $NH_3$ ambient. FIG. 1 is a cross-sectional view of a conventional plug structure; wherein 1 is a silicon substrate or a patterned metal layer and 2 is an IMD layer having a contact hole or a via 21. For description convenience, a contact hole is also called a via hereinafter. A via 21 shown in FIG. 1 resembling a recess with circular cross section is first formed on an IMD layer 2 and then filled with interconnection material of TiN layer 3 and Al layer 4. However, a TiN layer 3 has a type of poor step coverage; for example, if a TiN layer is deposited to a thickness of 100 angstroms in a recess with diameter of 0.6 μ and aspect ratio (height/width) larger than 3, there would be a very thin region occurred in the corner of a recess, shown as Δ of FIG. 1 and thus causes the TiN layer to lose its barrier function.

For solving said problem of TiN layer, an alternative method is that it is replaced by W material for having not only a type of conformal step coverage but a refractory nature. However, W is a chemical product of expensive $WF_6$ gas so this method would increase manufacturing cost and make it unfavorable to mass production. Hence, a fabricating method of a via structure having a type of conformal step coverage, effectively preventing Al diffusion, and having a low manufacturing cost is urgently needed and the present invention provides a novel method to meet this requirement.

SUMMARY OF INVENTION

Therefore, an object of the invention is to provide a method of forming a barrier metal layer for a hot Al plug providing effective prevention of Al diffusion.

A further object of the invention is to provide a method of forming a barrier metal layer for a hot Al plug having a type of conformal step coverage and thus rasing production yield.

A still further object of the invention is to provide a method of forming a barrier metal layer for a hot Al plug which reduces manufacturing cost to make it feasible for mass production.

A barrier metal layer according to the present invention is a stacked structure comprising a top layer of Tungsten (W) formed by a Chemical Vapor Deposition (CVD) method and a bottom layer of TiN. Then, a Al interconnection layer deposited at high temperature fills a plug and finishes a plug structure having advantages of low manufacturing cost and full prevention of Al diffusion.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

Figure 1:
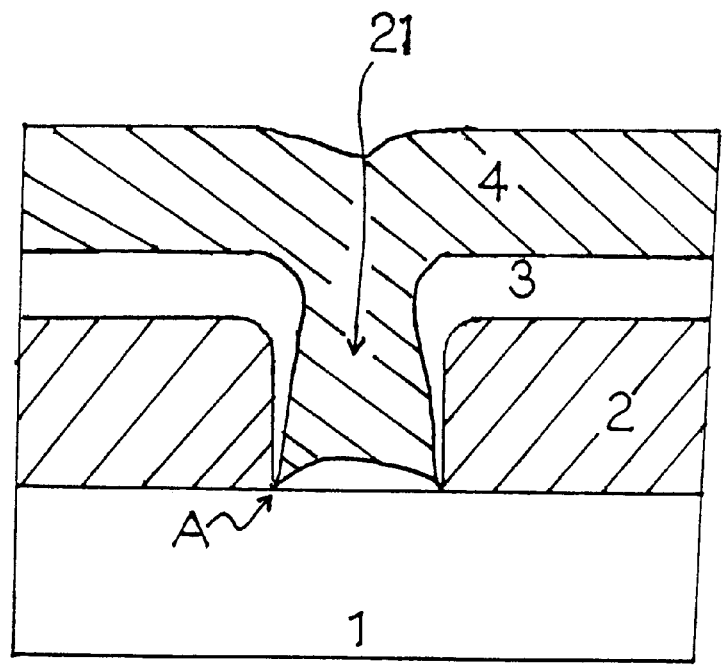
FIG. 1 is a cross-sectional view of a conventional plug structure.
Figure 2:
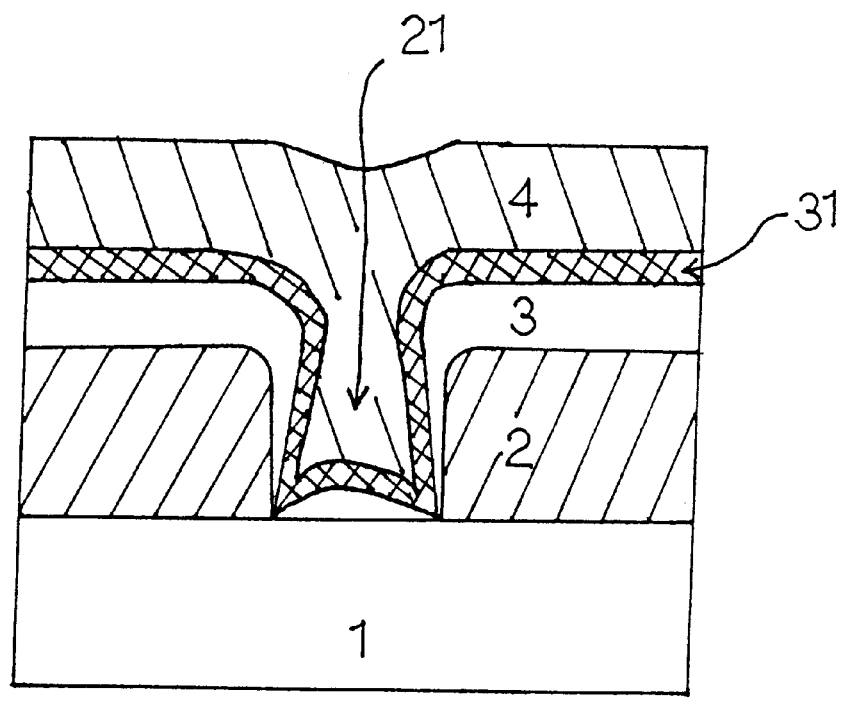
FIG. 2 is a cross-sectional view of a novel plug structure according to the present invention.

FIG. 2 is a cross-sectional view of a plug structure according to the present invention. For description convenience, there is only one via shown in FIG. 2 rather than a plurality of vias substantially formed on an IMD layer 2. Referring to FIG. 2, an IMD layer 2 is deposited over a silicon substrate 1 (the silicon substrate can be replaced by a patterned metal layer in a via structure case) and the material of an IMD layer 2 can be selected from the group consisting of silicon dioxide. Phosphosilicate Glass (PSG), and Boron-Phosphosilicate Glass (BPSG). Subsequently, a via 21 is formed after standard photolithography processes including exposure and developing and then etching an IMD layer 2 using a patterned photoresist as a mask. Next, a barrier metal layer 3 is formed over the IMD layer 2 and a via 21 to a thickness of 100 angstroms; wherein a barrier metal layer is TiN and its forming method is described previously. As described in foregoing article, a TiN layer can be formed by reactive sputtering Ti target in $N_2$ ambient or formed by first depositing Ti layer by a sputtering method and then annealed by a rapid thermal nitridation in $N_2$ or $NH_3$ ambient.

A W layer 31 is then deposited over the barrier metal layer 3 by a CVD method to a thickness of 500 A. The W layer 31 not only ameliorates step coverage of TiN layer but also provides a full prevention of Al diffusion when combined with the underlying TiN layer 3; thereby, the problem of Al pits occurred in source/drain regions is solved and thus eliminates a leakage current in devices and the reliability problem. In addition, Since the thickness of W layer 31 according to the invention is much thinner than that of W layer in a conventional plug structure, its manufacturing cost according to the invention can be remarkably reduced. Eventually, a hot Al layer 4 is deposited over the W layer 31 at a high temperature which is above the melting point of aluminum ° C. and used as an interconnection layer. The reason why we elevate the deposition temperature to 660° C., above melting point of Al metal, is that it can not only ameliorate step coverage of TiN layer but also flatten the surface of Al layer 4 by melting Al metal and flowing from a high position region of an IMD layer 2 to a low recess region of a via 21.

As a result, several features that the conventional art can not achieve are accomplished by the present invention as concluded as follows:

1. A plug structure according to the invention has a type of conformal step coverage, thereby remarkably increasing production yield.
2. Using the combination of W layer and TiN layer as a barrier metal layer according to the invention, the metal diffusion of interconnection layer such as Al atoms can be totally prevented, thereby eliminating Al pits and a leakage current occurred in the source/drain regions of field effect transistors which is favorable to rasing reliability of devices.
3. The manufacturing cost according to the invention can be remarkably reduced since the thickness of W layer is much thinner than that of the conventional art which is favorable to remarkably reduce the expenditure of $WF_6$ gas.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

What is claimed is:

1. In a method for forming plugs which comprises the steps of depositing an intermetal dielectric layer over a silicon substrate or a patterned metal layer; and forming vias of said intermetal dielectric layer; wherein the improvement comprises:

a. forming a multiple layered barrier layer on said vias wherein said barrier layer consists of a TiN layer and a W layer and said barrier layer is formed by coating said vias with said TiN layer and depositing said W layer on said TiN layer; and then b. filling said vias with aluminum to form said plugs by depositing aluminum on said W layer, wherein said aluminum is deposited at a temperature above the melting point of aluminum.

2. The method of claim 1 wherein the material of the intermetal dielectric layer is selected from the group consisting of silicon dioxide, PSG, and BPSG.

3. The method of claim 1 wherein the material of the intermetal dielectric layer is selected from the group consisting of silicon dioxide, PSG, and BPSG; and said intermetal dielectric layer is deposited on a silicon substrate.

4. The method of claim 1 wherein the material of the intermetal dielectric layer is selected from the group consisting of silicon dioxide, PSG and BPSG; and the deposition of the intermetal dielectric layer is over a patterned metal layer.

5. The method of claim 1 wherein the deposited W has a thickness of about 500 angstroms and the deposited TiN has a thickness of about 100 angstroms.

* * * * *